United States Patent [19]

Ichimura et al.

[11] Patent Number: 4,891,300
[45] Date of Patent: Jan. 2, 1990

[54] SAPONIFIED POLYVINYL ACETATE DERIVATIVES WHICH ARE PHOTOSENSITIVE RESIN COMPOSITIONS

[76] Inventors: Kunihiro Ichimura, 630-2, Matsushiro 5-chome, Yatabe-cho, Tsukuba-gun, Ibaraki; Hiroshi Itoh; Shuuichi Nakazato; Hideaki Takazawa, all c/o Oji Kako Co., Ltd. Shohin Kenkyujo, 27-2, Hiraide Kogyo Danchi, Utsunomiya-shi, Tochigi, all of Japan

[21] Appl. No.: 99,959

[22] Filed: Sep. 23, 1987

[30] Foreign Application Priority Data

Sep. 25, 1986 [JP] Japan .................................. 61-224997

[51] Int. Cl.$^4$ ........................ G03C 1/70; G03C 1/71
[52] U.S. Cl. ................................... 430/283; 430/287; 522/149; 525/58; 525/59
[58] Field of Search ................. 430/283, 287; 522/149; 525/58, 59

[56] References Cited

U.S. PATENT DOCUMENTS

| | | | |
|---|---|---|---|
| 3,825,430 | 7/1974 | Kurka | 430/287 |
| 4,001,016 | 1/1977 | Rosenkranz et al. | 430/287 X |
| 4,272,620 | 6/1981 | Ichimura | 430/287 X |

FOREIGN PATENT DOCUMENTS

| | | | |
|---|---|---|---|
| 0199706 | 11/1984 | Japan | 525/59 |
| 2030575 | 5/1979 | United Kingdom . | |
| 2076826 | 2/1980 | United Kingdom . | |

OTHER PUBLICATIONS

Patent Abstract of Japan, vol. 10, No. 260, (P-494)[2316], Sep. 5, 1986; & JP-A-61 87 153 (Agency of Ind. Science & Technol.) 02-05-1986.
Patent Abstract of Japan, vol. 10, No. 260, (P-494)[2316], Sep. 5, 1986; & JP-A-61 87 150 (Agency of Ind. Science & Technol.) 02-05-1986.
Patent Abstract of Japan, vol. 9, No. 20, (P-330)[1743], Jan. 26, 1985 & JP-A-59 166 945 (Nihon Kankoushi Kogyo K.K.) 20-09-1984.
Patent Abstract of Japan, vol. 9, No. 6, (P-326)[1729], Jan. 11, 1985; & JP-A-59 154 442 (Ouji Seishi K.K.) 03-09-1984.
Patent Abstract of Japan, vol. 9, No. 151, (P-367)[1974], Jun. 26, 1985; & JP-A-60 29 740 (Toshiba K.K.) 15-02-1985.

*Primary Examiner*—Paul R. Michl
*Assistant Examiner*—Cynthia Hamilton
*Attorney, Agent, or Firm*—Armstrong, Nikaido, Marmelstein, Kubovcik & Murray

[57] ABSTRACT

A photosensitive resin composition comprising a photosensitive saponified poly(vinyl acetate) derivative containing in the backbone thereof at least one of a first group of photosensitive units which are represented by the general formula (I)

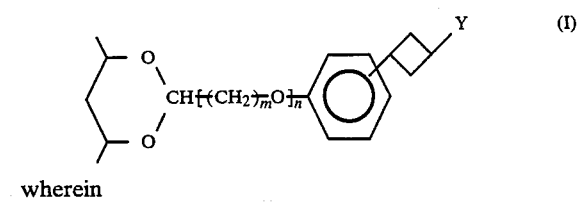

(I)

wherein

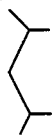

represents a vinyl alcohol residue in the backbone of the saponified poly(vinyl acetate) derivative; Y represents a member selected from the group consisting of the following general formulae (II) and (III)

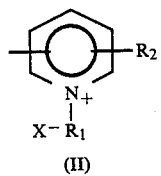 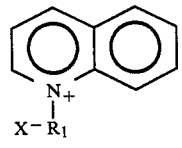

(II)    (III)

m denotes an integer of 1–6; n denotes 0 or 1; $R_1$ represents a member selected from a hydrogen atom, an unsubstituted alkyl and an unsubstituted aralkyl group, a hydroxyl group, a carbamoyl group, an ether bond and an unsaturated bond; $R_2$ represents a member selected from a hydrogen atom and a lower alkyl group; and $X^-$ represents an anion, and at least one of a second group of photosensitive units having an ethylenic unsaturated double bond which are represented by the general formulae (IV) and (V)

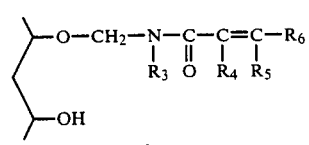

(IV)

and

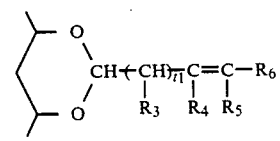

(V)

wherein

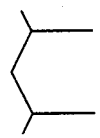

is as defined above; $R_3$ represents a member selected from a hydrogen atom, a lower alkyl group, a nitrophenyl group, a halogen atom, an aminophenyl group and a phenyl group; $R_4$, $R_5$ and $R_6$ respectively represent a member selected from a hydrogen atom, a lower alkyl atom, a halogen and a phenyl group; and $t_1$ represents 0 or 1.

9 Claims, No Drawings

SAPONIFIED POLYVINYL ACETATE DERIVATIVES WHICH ARE PHOTOSENSITIVE RESIN COMPOSITIONS

BACKGROUND OF THE INVENTION

1. Field of the Invention

The present invention relates to a photosensitive resin composition. More particularly, it relates to a photosensitive resin composition which is not affected by oxyen, capable of image formation, has an excellent sensitivity, water resistance, solvent resistance, acid resistance, alkali resistance, water developing property, and resolving power and can be used for the production of screen printing plates, second originals, planographs, reliefs, plano-intaglios, television fluorescent screens and the like, and for the precision metal processing of printed circuit substrates with resist images and the like.

2. Description of the Related Art

A photosensitive resin compound comprising a saponified poly(vinyl acetate) and a styrylpyridinium salt compound or styrylquinolinium salt compound is known (see Japanese Patent Publication No. 1306/85). This photosensitive resin compound has a high sensitivity, but has the following drawback. That is, the photoreaction of this photosensitive resin is a photocrosslinking reaction caused by the photodimerization of a styrylpyridinium salt compound or styrylquinolinium salt compound grafted to the saponified poly(vinyl acetate). Accordingly, the amount of the hydroxyl group contained in the saponified poly(vinyl acetate) in the photosensitive layer is not varied by irradiation, and therefore, has a disadvantage in that a high resolving power cannot be obtained because a significant swelling thereof occurs upon water development due to a poor water resistance at parts which have bee hardened by irradiation.

As a means for overcoming this drawback, an increase in the rate of introducing the styrylpyridinium salt compound or styrylquinolinium salt compound into the saponified poly(vinyl acetate) has been considered, but in this method, it is impossible to coat an aluminium plate or a gauze for screen printing with the photosensitive resin compound obtained because of an extensive increase of the viscosity of the aqueous solution thereof. The styrylquinolinium salt compound and the styrylpyridinium salt compound also are disadvantageous in that a satisfactory water resistance can not be obtained, probably because they contain a quaternary ammonium salt, or the crosslinking rate by photodimerization can not be increased to a satisfactory extent even if the rate at which the styrylpyridinium salt compound and the styrylquinolinium salt compound, are introduced is increased.

Another prior art discloses a photosensitive resin compound obtained from a saponified poly(vinyl acetate) and an N-methylolacrylamide or N-methylolmethacrylamide (see Japanese Patent Publication No. 5923/74). This photosensitive resin composition comprising a saponified poly(vinyl acetate) and an N-methylolacrylamide or N-methylolmethacrylamide has an excellent water resistance, but has the defects of a low resolving power and low sensitivity, or the like.

Accordingly, the prior art does not suggest that a photosensitive resin compound having a high sensitivity and excellent water resistance, solvent resistance and resolving power can be obtained by combining and introducing one or more of at least one of a styrylpyridinium salt compound of a styrylquinolinium salt compound and at least one of a N-methylolacrylamide or N-methylolmethacrylamide into the saponified poly(vinyl acetate).

SUMMARY OF THE INVENTION

Therefore, the primary object of this invention is to provide a photosensitive resin composition which can be water developed, has an excellent water resistance, solvent resistance, acid resistance, alkali resistance and resolving power and a high sensitivity, to eliminate the drawbacks of the art mentioned above.

According to the present invention, there is provided a photosensitive resin composition which comprises a photosensitive saponified poly(vinyl acetate) derivative containing in the backbone thereof at least one of a first group of photosensitive units which are represented by the general formula (I)

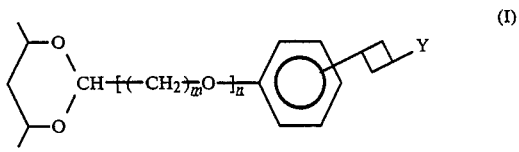

wherein

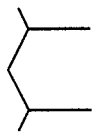

represents a vinyl alcohol residue in the backbone of the saponified polyvinyl acetate derivative the Y represents a member selected from the groups consisting of the following general formulae (II) and (III)

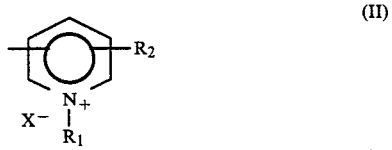

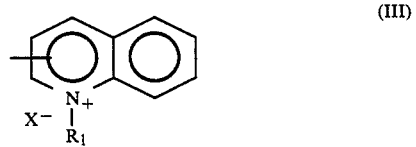

m denotes an integer of 1–6; n denotes 0 or 1; $R_1$ represents a member selected from a hydrogen atom, an unsubstituted alkyl and an unsubstituted aralkyl group, and alkyl and aralkyl groups containing a member selected from a hydroxyl group, a carbamoyl group, an ether bond and an unsaturated bond; $R_2$ represents a member selected from a hydrogen atom and a lower alkyl group; and $X^-$ represents an anion, and at least one of a second group of photosensitive units having an ethylenic unsaturated double bond which are represented by the general formulae (IV) and (V)

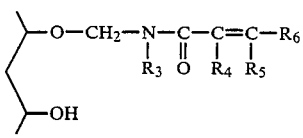

and

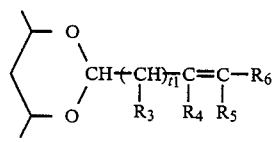

wherein

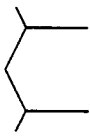

is as defined above; $R_3$ represents a member selected from a hydrogen atom, a lower alkyl group, a nitrophenyl group, a halogen atom, an aminophenyl group and a phenyl group, $R_4$, $R_5$ and $R_6$ respectively represent a member selected from a hydrogen atom, a lower alkyl atom, a halogen and a phenyl group; and $t_1$ represents 0 or 1.

DESCRIPTION OF THE PREFERRED EMBODIMENTS

The photosensitive resin composition of this invention comprises, as mentioned above, containing in the saponified poly(vinyl acetate) derivative photosensitive units selected from the first group thereof and photosensitive units selected from the second group thereof.

The photosensitive units in the first group are bonded to a vinyl alcohol unit in the backbone of the saponified poly(vinyl acetate) and are represented by the general formula (I).

The groups having the general formulae (II) and (III), which are respectively represented by Y in the aforementioned formula (I), are a pyridinium salt residue and a quinolinium salt residue and are generally included in quaternary ammonium salt residues.

In the general formulae (II) and (III), $R_1$ is selected from a hydrogen atom; an unsubstituted alkyl group, preferably having 1-6 carbon atoms, more preferably 1-4 carbon atoms, such as a methyl group, an ethyl group, a propyl group, a butyl group, a pentyl group, a hexyl group or the like; an unsubstituted aralkyl group such as a benzyl group; a phenylethyl group, a methylbenzyl group, a naphthylmethyl group or the like; and an alkyl group and aralkyl group having substituted with least one member selected from a hydroxy group, a carbamoyl group, an ether group and an unsaturated bond (e.g. double bond).

In the general formulae (II) and (III), $R_2$ is selected from a hydrogen atom and a lower alkyl group, preferably an alkyl group having 1-6 carbon atoms, more preferably 1-4 carbon atoms, such as a methyl group, an ethyl group, a propyl group, a butyl group, a hexyl group or the like; and $X^-$ represents an anion such as a chlorine ion, a bromine ion, a sulfate ion, a phosphate ion, a perchlorate ion, a methoxysulfate ion, p-toluenesulfonate ion, a hydroborofluorate ion or the like.

The photosensitive units in the second group are bonded to a vinyl alcohol unit of the backbone of the saponified poly(vinyl acetate) derivative and are represented by the general formulae (IV) and (V). In the general formulae (IV) and (V), $R_3$ represents a member selected from a hydrogen atom, a lower alkyl group, a nitrophenyl group, a halogen atom, an aminophenyl group and a phenyl group; $R_4$, $R_5$ and $R_6$ respectively represent a member selected from a hydrogen atom, a lower alkyl group, a halogen atom, and a phenyl group; and $t_1$ denotes 0 or 1.

As the sensitizer useful for the photosensitive resin composition of this invention, benzophenone, a benzoin alkyl ether, Rose Bengal, Methylene Blue, hydroxycyclohexyl phenyl ketone, a thioxantone derivative, Michler's ketone, 4,4'-bisdiethylaminobenzophenone, benzyl, benzyl dimethyl ketal and the like can be used.

In the photosensitive resin of this invention, the saponified poly(vinyl acetate) derivative is selected from a saponification product (a) of a copolymer of vinyl acetate and at least one of an ethylenic unsaturated compound such as butyl acrylate, vinyl hexylate, vinyl 2,2'-dibutylhexylate, acrylic acid, methacrylic acid, acrylamide, N-methylolacrylamide, styrene, ethylene, propylene, maleic anhydride, acrylonitrile and the like, a saponification product of a poly(vinyl acetate) (b), an acetalization product of a saponification product (a) or (b) with butyl aldehyde, nitrobenzaldehyde, formaldehyde, benzaldehyde, aminobenzaldehyde, aminoacetaldehyde diethyl acetal or the like, or a mixture of at least two selected from (a), (b) or (c). The saponified poly(vinyl acetate) derivative also may be selected from reaction products or saponified poly(vinyl acetates) and organic halides.

The vinyl acetate unit of the saponified copolymer (a) prior to saponification is preferably in a proportion of 50-100 mole% to the total vinyl units. If the amount of the vinyl acetate unit is 50 mole% or less, the saponified copolymer (a) is not preferred because of the insolubility thereof in water. The acetalized product (c) is preferably substituted by an acetal group in an amount of 0-50 mole% of the vinyl alcohol unit of the saponified product (a) or (b). If the substitution ratio (acetalization ratio) is 50 mole% or more, the acetalized product (c) is not preferred because of the insolubility thereof in water.

The amount of the vinyl alcohol unit contained in the saponified poly(vinyl acetate) derivative is preferably in a proportion of 50–100 mole% to the amount of the vinyl structural units. If the vinyl alcohol unit is 50 mole% or less, the saponified poly(vinyl acetate) derivative is not preferred because of the insolubility thereof in water. The polymerization degree of the saponified poly(vinyl acetate) derivative is preferably in the range of 300–400. Moreover, preferably 0.1–20 mole%, more preferably 0.5–15 mole%, of the vinyl alcohol unit contained in the vinyl structural units of the saponified poly(vinyl acetate) derivative is substituted by the first group of the aforementioned photosensitive units and 0.1–40 mole%, preferably 1–30 mole% of the vinyl alcohol unit contained in the vinyl structural units of the saponified poly(vinyl acetate) derivative is substituted by the second group of the aforementioned photosensitive units.

If the amount of the photosensitive units of the first group is less than 0.1 mole% as mentioned above, the photosensitivity is often unsatisfactory. If the amount is 20 mole% or more, the photosensitivity is not significantly increased but the viscosity of the resin solution is extensively increased. so that the solution becomes difficult use. Furthermore, if the amount of the photosensitive units of the second group is less than 0.1 mole%, the water resistance of the obtained harden resin is unsatisfactory. If the amount is 40 mole% or more, water development of the photosensitive resin composition obtained becomes difficult and the resolving power is poor.

The amount of the vinyl alcohol structural unit is preferably in a proportion of 50–99.8 mole%, more preferably 60–95 mole%, to the amount of the vinyl structural unit as the backbone of the saponified poly(vinyl acetate) derivative (photosensitive resin of this invention) substituted by the first group of the photosensitive units and the second group of the photosensitive units. If the amount of the vinyl alcohol structural unit is 50 mole% or less, the derivative is not preferred because of the insolubility thereof in water. If the amount is 99.8 mole% or more, the number of crosslinking points by photocrosslinking becomes too small to obtain a good image.

Photosensitive resin compositions comprising a saponified poly(vinyl acetate) derivative containing in the backbone thereof only the photosensitive units in the first group, already known in the art, have a high sensitivity but an unsatisfactory water resistance at the image parts even when irradiated with active light, and the image parts are considerably swollen when water is used as a developing solution, which degrades the resolving power, and thus cannot be used with an aqueous ink.

Photosensitive resin compositions comprising a saponified poly(vinyl acetate) derivative containing in the backbone thereof only the photosensitive units in the second group, already known in the art, have an excellent water resistance of the image parts formed by irradiating active light and thus can be used with an aqueous ink. However, the sensitivity and resolving power thereof are low, probably due to light scattering of the irradiated light in the photosensitive layer. But the photosensitive resin composition comprising a saponified poly(vinyl acetate) derivative containing the photosensitive units in the first and second groups has a high sensitivity and an extraordinarily high resolving power. This may be because of the following effects:

1. Water resistance at the image parts is improved by photocrosslinking between the photosensitive units of the first group and between the photosensitive units of the second group and thus the bloating of the formed image parts is decreased, so that the inherent resolving power of the photosensitive units of the first group is obtained (if the photosensitive units have a high resolving power). As a result, the resolving power is improved.

2. The photosensitive units of the first group have high extinction coefficients in the wavelengths 300–400 nm, which are effective for photocrosslinking of the photosensitive units of the second group, so that light scattering in the wavelength 300–400 nm is prevented. Accordingly, scattered light in the wavelengths 300–400 nm does not reach the part where light is not irradiated (non-image part), so that the photosensitive units of the second group will cause little unnecessary photocrosslinking, which will decrease the resolving power. As a result, the resolving power is improved.

Furthermore, if active light is irradiated at the image part formed after water development, a part of the photosensitive units of the second group will remain unreacted and will cause a complete photocrosslinking, so that water resistance is improved.

Moreover, the photosensitive resin composition (A) comprising the photosensitive resin composition (B) of this invention, a saponified polyvinyl acetate derivative (C) containing the photosensitive units of the first group and an ethylenic unsaturated compound (D) in which a photopolymerization initiator has been dissolved in very sensitive and has an excellent water resistance, solvent resistance, water-containing solvent resistance, acid resistance, alkali resistance resolving power and wear resistance after printing, compared with those of a photosensitive resin composition (E) comprising only a saponified poly(vinyl acetate) derivative (C) containing the photosensitive units of the first group and an ethylenic unsaturated compound (D) in which a photopolymerization initiator has been dissolved. This is assumed to be because the photosensitive resin comprises photosensitive units of the first and second groups, so that the saponified poly(vinyl acetate) derivative (C) containing the photosensitive units of the first group and the ethylenic unsaturated compound (D) in which a photopolymerization initiator has been dissolved are capable of forming a satisfactory tight photocrosslinking through the photosensitive resin composition of this invention (B).

Moreover, the photosensitive resin composition (F) comprising the photosensitive resin composition (B) of this invention and an ethylenic unsaturated compound (D) in which a photopolymerization initiator has been dissolved in very sensitive and has an excellent water resistance, solvent resistance, water-containing solvent resistance, acid resistance, alkali resistance, resolving power and wearing property on printing as compared with those of a photosensitive resin composition (A) mentioned above.

The photosensitive resin composition of this invention is effectively prepared by the condensation reaction of (1) a saponified poly(vinyl acetate) derivative, (2) at least one quaternary ammonium salt compound (styrylpyridinium salt compound and styrylquinolinium salt compound) as a photosensitive unit introducing agent represented by the following general formulae (VI) and (VII)

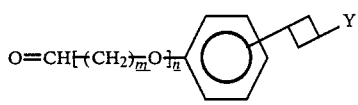

(VI)

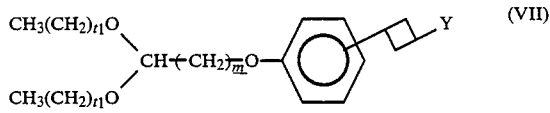

(VII)

wherein Y, m and n are as defined above, and $t_1$ denotes 0 or 1, including styrylpyridinium salt compounds such as 1-methyl-4-{2-[4-(2,2-dimethoxyethoxy)phenyl]ethenyl}pyridinium methosulfate, N-methyl-4-(p-formylstyryl)pyridinium methosulfate, N-methyl-2-(formylstyryl)pyridinium hydrochloride and the like and styrylquinolinium salt compounds such as 1-methyl-4-{2-[4-(2,2-dimethoxyethoxy)phenyl]ethenyl}quinolinium methosulfate, N-methyl-4-(p-formylstyryl)quinolinium methosulfate, N-methyl-2-(formylstyryl)quinolinium hydrochloride and the like, and (3) at least one light polymerizable ethylenic unsaturated compound as a photosensitive unit introducing agent of the second group represented by the following general formulae (VIII) and (IX)

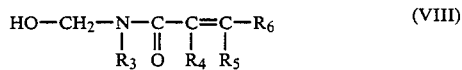

(VIII)

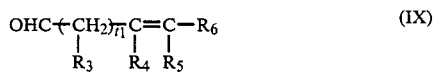

(IX)

wherein $R_3$, $R_4$, $R_5$ and $t_1$ are as defined above, and X represents a halogen atom such as Cl, Br, I or the like, including, for example, N-methylolacrylamide, N-methylolmethacrylamide, acrolein and crotonaldehyde in the presence of an acid catalyst.

The photosensitive resin composition of this invention has a high sensitivity and can be developed by water, since the photosensitive units of the first group represented by the general formula (I) and the photosensitive units of the second group represented by the general formulae (IV) and (V) have been introduced into the saponified poly(vinyl acetate) derivative. This composition can also form images having an excellent water resistance, solvent resistance, and resolving power.

The invention will be further illustrated by the following examples.

EXAMPLE 1

100 g of a saponified polyvinyl acetate derivative [A] (having a polymerization degree of 1,800 and a saponification degree of 88 mole%) was dissolved in 900 g of water. In this aqueous solution were dissolved 10 g ($3.0 \times 10^{-2}$ mole) of N-methyl-4-(p-formyl-styryl)pyridinium methosulfate and 30 g ($3.0 \times 10^{-1}$ mole) of N-methylolacrylamide. The pH value was adjusted to 2.5 with phosphoric acid. After 1 g of 1% aqueous methoxyhydroquinone solution had been added, the mixture was reacted at 60° C. for 20 hours. To 700 g of the reaction solution was added a solution of 2 g of 2,4-diethylthioxanthone and 4 g of ethyl p-dimethylaminobenzoate in 20 g of ethyl alcohol, and the mixture was stirred. The composition was coated on a screen printing plate (250 mesh nylon) and dried to form a photosensitive layer having a thickness of 5μ. Then, a photosensitive plate for screen printing (A) was obtained by curing at 50° C. for 24 hours. A negative film and a Step Tablet No. 2 (manufactured by KODAK Co.) were placed on the photosensitive plate for screen printing (A) and was irradiated for 15 seconds with a 3 kW ultra-high pressure mercury lamp located at a height of 1 m from the plate. Then, the photosensitive plate was developed with water. The exposed area was left while the non-exposed area was washed away, whereby an image was formed.

The results are shown in Table 1.

The photosensitive resin on the photosensitive plate for screen printing (A) was dissolved again in water and purified by re-precipitating in acetone. UV spectroscopy and bromometric analysis of the purified product showed that the vinyl alcohol unit substituted by N-methyl-4-(p-formylstyryl)pyridinium methosulfate was in a proportion of 2.8 mole% to the vinyl alcohol unit contained in the saponified polyvinyl acetate derivatie [A] and that the vinyl alcohol unit substituted by N-methylol acrylamide was in a proportion of 15 mole% to the vinyl alcohol unit contained in the saponified poly(vinyl acetate) derivative [A].

COMPARATIVE EXAMPLE 1—1

100 g of the saponified poly(vinyl acetate) derivative [A] (having a polymerization degree of 1,800 and a saponification degree of 88 mole%) was dissolved in 900 g of water. In this aqueous solution was dissolved 10 g ($3.0 \times 10^{-2}$ mole) of N-methyl-4-(p-formylstyryl)pyridinium methosulfate. The pH value was adjusted to 2.5 by phosphoric acid, and the mixture was reacted at 60° C. for 20 hours. An image was then formed in the same manner as in Example 1. The results are shown in Table 1.

COMPARATIVE EXAMPLE 1-2

100 g of the saponified poly(vinyl acetate) derivative [A] (having a polymerization degree of 1,800 and a saponification degree of 88 mole%) was dissolved in 900 g of water. In this aqueous solution was dissolved 65 g ($1.9 \times 10^{-1}$ mole) of N-methyl-4-(p-formylstyryl)pyridinium methosulfate. The pH value was adjusted to 2.5 with phosphoric acid, and the mixture was reacted at 60° C. for 20 hours. An image was formed in the same manner as in Example 1.

The results are shown in Table 1.

COMPARATIVE EXAMPLE 1-3

100 g of the saponified polyvinyl acetate derivative [A] (having a polymerization degree of 1,800 and a saponification degree of 88 mole%) was dissolved in 900 g of water. In this aqueous solution was dissolved 111 g ($3.3 \times 10^{-1}$ mole) of N-methyl-4-(p-formylstyryl)pyridinium methosulfate. The pH value was adjusted to 2.5 with phosphoric acid, and upon reaction at 60° C. for 20 hours, the solution was gelled.

COMPARATIVE EXAMPLE 1-4

100 g of the saponified poly(vinyl acetate) derivative [A] (having a polymerization degree of 1,800 and a saponification degree of 88 mole%) was dissolved in 900 g of water. In this aqueous solution were dissolved 33 g ($3.3. \times 10^{-1}$ mole) of N-methylol acrylamide. The pH value was adjusted to 2.5 by phosphoric acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 1-5

100 g of the saponified poly(vinyl acetate) derivative [A] (having a polymerization degree of 1,800 and a saponification degree of 88 mole%) was dissolved in 900 g of water. In this aqueous solution were dissolved 10 g ($3.0 \times 10^{-2}$ mole) of N-methyl-4-(p-formylstyryl)-pyridinium methosulfate and 21 g ($3.0 \times 10^{-1}$ mole) of acrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

EXAMPLE 2

100 g of the saponified poly(vinyl acetate) derivative [A] (having a polymerization degree of 1,800 and a saponification degree of 88 mole%) was dissolved in 900 g of water. In this aqueous solution were dissolved 10 g ($3.0 \times 10^{-2}$ mole) of N-methyl-4-(p-formylstyryl)-pyridinium methosulfate and 15 g ($2.1 \times 10^{-1}$ mole) of crotonaldehyde. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 2-1

100 g of the saponified poly(vinyl acetate) derivative [A] was dissolved in 900 g of water. In this aqueous solution was dissolved 10 g ($3.0 \times 10^{-2}$ mole) of N-methyl-4-(p-formylstyryl)pyridinium methosulfate. The pH value was adjusted to 2.5 with phosphoric acid, and the mixture was reacted at 60° C. for 20 hours. An image was formed in the same manner as in Example 1. The results are shown in Table 1.

COMPARATIVE EXAMPLE 2-2

100 g of the saponified poly(vinyl acetate) derivative [A] was dissolved in 900 g of water. In this aqueous solution was dissolved 15 g ($2.1 \times 10^{-1}$ mole) of crotonaldehyde. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

EXAMPLE 3

100 g of a saponified poly(vinyl acetate) derivative [B] [saponified copolymer of vinyl acetate/vinyl hexylate (95% mole%/5 mole%) having a vinyl alcohol content per vinyl structural units in the backbone of 75 mole% and a polymerization degree of 1,800] was dissolved in 10% aqueous dioxane solution. In this aqueous solution were dissolved 5 g ($1.1 \times 10^{-2}$ mole) of N-methyl-4-{2-[4-(2,2-dimethoxyethoxy)phenyl]ethenyl}quinolinium methosulfate and 20 g ($1.7 \times 10^{-1}$ mole) of N-methylolmethacrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 3-1

100 g of the saponified poly(vinyl acetate) derivative [B] was dissolved in 10% aqueous dioxane solution. In this aqueous solution was dissolved 5 g ($1.1 \times 10^{-2}$ mole) of N-methyl-4-{2-[4-(2,2-dimethoxyethoxy)phenyl]ethenyl}quinonolinium methosulfate. The pH value was adjusted to 2.5 with phosphoric acid, and the mixture was reacted at 60° C. for 20 hours. An image was formed in the same manner as in Example 1. The results are shown in Table 1.

COMPARATIVE EXAMPLE 3-2

100 g of the saponified polyvinyl acetate derivative [B] was dissolved in 10% aqueous dioxane solution. In this aqueous solution was dissolved 20 g ($1.7 \times 10^{-1}$ mole) of N-methylol methacrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

EXAMPLE 4

100 g of a saponified poly(vinyl acetate) derivative [C][saponified copolymer of vinyl acetate/ethylene (90 mole%/10 mole%) having a vinyl alcohol content per vinyl structural units in the backbone of 85 mole% and a polymerization degree of 600] was dissolved in 900 g of water. In this aqueous solution were dissolved 35 g ($7.4 \times 10^{-2}$ mole) of N-methyl-4-{p-(2,2-dimethoxyethoxy)styryl}pyridinium p-toluene-sulfonate and 35 g ($3.5 \times 10^{-1}$ mole) of N-methylolacrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 4-1

100 g of the saponified poly(vinyl acetate) derivative [C] was dissolved in 900 g of water. In this aqueous solution was dissolved 35 g ($7.4 \times 10^{-2}$ mole) of N-methyl-4-{p-(2,2-dimethoxyethoxy)styryl}pyridinium p-toluene-sulfonate. The pH value was adjusted to 2.5 with phosphoric acid and the mixture was reacted at 60° C. for 20 hours. An image was formed in the same manner as in Example 1. The results are shown in Table 1.

COMPARATIVE EXAMPLE 4-2

100 g of the saponified poly(vinyl acetate) derivative [C] was dissolved in 900 g of water. In this aqueous solution was dissolved 35 g ($3.5 \times 10^{-1}$ mole) of N-methylol acrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

EXAMPLE 5

100 g of a saponified poly(vinyl acetate) derivative [D][saponified copolymer of vinyl acetate/maleic anhydride (99 mole%/1 mole%) having a vinyl alcohol content per vinyl structural units in the backbone of 82 mole% and a polymerization degree of 1,000] was dissolved in 900 g of water. In this aqueous solution were dissolved 25 g ($8.7 \times 10^{-2}$ mole) of N-(2-hydroxyethyl)-4-(p-formylstyryl)pyridinium chloride and 30 g ($3.0 \times 10^{-1}$ mole) of N-methylolacrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 5-1

100 g of the saponified poly(vinyl acetate) derivative [D] was dissolved in 900 g of water. In this aqueous solution was dissolved 25 g ($8.7 \times 10^{-2}$ mole) of N-(2-hydroxyethyl)-4-(p-formylstyryl)pyridinium chloride. The pH value was adjusted to 2.5 with phosphoric acid and the mixture was reacted at 60° C. for 20 hours. An image was formed in the same manner as in Example 1. The results are shown in Table 1.

COMPARATIVE EXAMPLE 5-2

100 g of the saponified poly(vinyl acetate) derivative [D] was dissolved in 900 g of water. In this aqueous solution was dissolved 30 g ($3.0 \times 10^{-1}$ mole) of N-methylolacrylamide. The pH value was adjusted to 2.5 with phosphoric acid. After 1 g of 1% aqueous methoxyhydroquinone solution had been added, the mixture was reacted at 60° C. for 20 hours. An image was formed in the same manner as in Example 1. The results are shown in Table 1.

EXAMPLE 6

100 g of a saponified poly(vinyl acetate) derivative [E][butyralization product of the saponified poly(vinyl acetate) having a vinyl alcohol content substituted by butyraldehyde per vinyl structural units in the backbone of 8 mole%, a vinyl alcohol content per vinyl structural units in the backbone of 90 mole% and a polymerization degree of 1,800 was dissolved in 10% aqueous ethanol solution. In this aqueous solution were dissolved 8 g ($2.2 \times 10^{-2}$ mole) of N-ethyl-2-(p-formylstyryl)quinolinium bromide and 25 g ($2.5 \times 10^{-1}$ mole) of N-methylolacrylamide. The pH value was adjusted to 2.5 with p-toluenesulfonic acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 6-1

100 g of the saponified poly(vinyl acetate) derivative [E] was dissolved in 10% aqueous ethanol solution. In this aqueous solution was dissolved 8 g ($2.2 \times 10^{-2}$ mole). The pH value was adjusted to 2.5 with p-toluenesulfonic acid. After 1 g of 1% aqueous methoxyhydroquinone solution had been added, the mixture was reacted at 60° C. for 20 hours. An image was formed in the same manner as in Example 1. The results are shown in Table 1.

COMPARATIVE EXAMPLE 6-2

100 g of the saponified poly(vinyl acetate) derivative [E] was dissolved in 10% aqueous ethanol solution. In this aqueous solution was dissolved 25 g ($2.5 \times 10^{-1}$ mole) of N-methylolacrylamide. The pH value was adjusted to 2.5 with p-toluenesulfonic acid. After 1 g of 1% aqueous methoxyhydroquinone solution had been added, the mixture was reacted at 60° C. for 20 hours. An image was formed n the same manner as in Example 1, an image was formed. The results are shown in Table 1.

TABLE 1

| Example No. | Vinyl alcohol unit substituted by the photosensitive unit of the first group (mole %) | Vinyl alcohol unit substituted by the photosensitive unit of the second group (mole %) | Exposure time (sec) 3 kW ultra-high pressure mercury light, distance: 1 m | Residual steps after development Kodak Step Tablet No. 2 | Resolving degree ($\mu$) | Adhesion with screen gauze |
|---|---|---|---|---|---|---|
| Example 1 | 2.8 | 15 | 10 | 5 | 70 | good |
| Example 2 | 2.8 | 20 | 10 | 5 | 70 | good |
| Example 3 | 1.4 | 11 | 8 | 5 | 70 | good |
| Example 4 | 6.6 | 16 | 8 | 5 | 60 | good |
| Example 5 | 7.7 | 16 | 10 | 5 | 70 | good |
| Example 6 | 2.0 | 11 | 8 | 5 | 70 | good |
| Comparative Example 1-1 | 2.8 | 0 | 12 | 5 | 110 | poor |
| Comparative Example 1-2 | 18 | 0 | 7 | 5 | 100 | poor |
| Comparative Example 1-4 | 0 | 16 | 25 | 5 | 120 | good |
| Comparative Example 1-5 | 2.8 | 0 | 12 | 5 | 110 | poor |
| Comparative Example 2-1 | 2.8 | 0 | 10 | 5 | 110 | poor |
| Comparative Example 2-2 | 0 | 20 | 28 | 5 | 110 | good |
| Comparative Example 3-1 | 1.4 | 0 | 10 | 5 | 110 | poor |
| Comparative Example 3-2 | 0 | 11 | 30 | 5 | 110 | good |
| Comparative Example 4-1 | 6.6 | 0 | 10 | 5 | 110 | poor |
| Comparative Example 4-2 | 0 | 16 | 30 | 5 | 120 | good |
| Comparative Example 5-1 | 7.7 | 0 | 12 | 5 | 110 | poor |
| Comparative Example 5-2 | 0 | 16 | 32 | 5 | 110 | good |
| Comparative Example 6-1 | 2.0 | 0 | 8 | 5 | 110 | poor |

TABLE 1-continued

| Example No. | Vinyl alcohol unit substituted by the photosensitive unit of the first group (mole %) | Vinyl alcohol unit substituted by the photosensitive unit of the second group (mole %) | Exposure time (sec) 3 kW ultra-high pressure mercury light, distance: 1 m | Residual steps after development Kodak Step Tablet No. 2 | Resolving degree ($\mu$) | Adhesion with screen gauze |
| --- | --- | --- | --- | --- | --- | --- |
| Comparative Example 6-2 | 0 | 11 | 24 | 5 | 110 | good |

EXAMPLE 7

200 g of a saponified poly(vinyl acetate) derivative (manufactured by the Nippon Synthetic Chemical Industry Co., Ltd., having a polymerization degree of 500 and a saponification degree of 88 mole%) was dissolved in 800 g of water. In this aqueous solution were dissolved 4.0 g ($1.2 \times 10^{-1}$ mole) of N-methyl-4-(p-formylstyryl)pyridinium methosulfate and 40 g ($4.0 \times 10^{-1}$ mole) of N-methylolacrylamide. The pH value was adjusted to 2.5 with p-toluenesulfonic acid. After 1 g of 1% aqueous methoxyhydroquinone solution had been added, the mixture was reacted at 60° C. for 20 hours to give a solution (referred to hereinafter as component A).

With 1 kg of a poly(vinyl acetate) emulsion (saponified poly(vinyl acetate) derivative/poly(vinyl acetate)=30/70; solid content: 30%) having been emulsion-polymerized using a saponified poly(vinyl acetate) derivative (polymerization degree: 1,100; saponification degree: 88 mole%) were mixed 10 g of N-methyl-4-(p-formylstyryl)pyridinium methosulfate and 10 g of n-butyraldehyde. The pH value was adjusted to 2.5 with p-toluenesulfonic acid. After reaction at 60° C. for 20 hours, neutralization with an aqueous ammonia solution gave a photosensitive emulsion (referred to hereinafter as component B).

A mixed solution consisting of
Urethane Acrylate U-108A (manufactured by Shin-Nakamura-Kagaku K.K.): 100 g,
Diester Methacrylate 4G (manufactured by Shin-Nakamura-Kagaku K.K.): 100 g,
Triester Acrylate PE-3A (manufactured by Kyoeisha Yushi Kogyo K.K.): 50 g,
ethyl alcohol 50 g,
2-chlorothioxanthone 5 g,
and ethyl p-dimethylaminobenzoate: 10 g is referred to as component C.

The composition obtained by mixing 100 g of component A, 100 g of component B and 30 g of component C was coated on a screen printing plate (nylon, 250 mesh) in a thickness of 15$\mu$ and dried. A negative film and a Kodak Step Tablet No. 2 were placed on the photosensitive plate obtained, and was irradiated for 1 minute with a 3 kW ultra-high pressure memory light located at the height of 1 m from the plate. Then, the photosensitive plate was developed with water. The exposed area remained while the non-exposed area was washed away, whereby an image was formed. The image area of the screen printing plate obtained was rubbed with a gauze containing a mixed solvent consisting of acetone/water =70/30 100 times reciprocatingly, but no damage was observed in the image area.

COMPARATIVE EXAMPLE 7-1

200 g of a saponified poly(vinyl acetate) derivative (manufactured by The Nippon Synthetic Chemical Industry Co., Ltd., having a polymerization degree of 500 and a saponification degree of 88 mole%) was dissolved in 800 g of water. In this aqueous solution was dissolved 4.0 g ($1.2 \times 10^{-1}$ mole) of N-methyl-4-(p-formylstyryl) pyridinium methosulfate. The pH value was adjusted to 2.5 with phosphoric acid, and the mixture was reacted at 60° C. for 20 hours to give a solution (referred to hereinafter as component D).

The composition obtained by mixing 100 g of component D and 100 g and 30 g of components B and C as mentioned in Example 7 were coated on a screen printing plate (nylon, 250 mesh) in a thickness of 15$\mu$ and dried. A negative film and a Kodak Step Tablet No. 2 were placed on the photosensitive plate obtained, and light was irradiated for 1 minute with a 3 kW ulta-high pressure mercury light located at the height of 1 m from the plate. Then, the photosensitive plate was developed with water. The exposed area was left while the non-exposed area was washed away, whereby an image was formed. The image area of the screen printing plate obtained was rubbed with a gauze containing a mixed solvent consisting of acetone/water=70/30 100 times reciprocatingly, but the image having a thickness of 15$\mu$ on the screen was removed by the rubbing and the screen was exposed.

COMPARATIVE EXAMPLE 7-2

200 g of a saponified poly(vinyl acetate) derivative (manufactured by The Nippon Synthetic Chemical Industry Co., Ltd., having a polymerization degree of 500 and a saponification degree of 88 mole%) and dissolved in 800 g of water. In this aqueous solution was dissolved 53 g ($5.2 \times 10^{-1}$ mole) of N-methylolacrylamide. The pH value was adjusted to 2.5 with phosphoric acid or p-toluenesulfonic acid. After 1 g of 1% aqueous methoxyhydroquinone solution had been added, the mixture was reacted at 60° C. for 20 hours to give a solution (referred to hereinafter as component E).

The composition obtained by mixing 100 g component E and 100 g and 30 g of components B and C as mentioned in Example 7 were coated on a screen printing plate (nylon, 250 mesh) in a thickness of 15$\mu$ and dried. A negative film and a Kodak Step Tablet No. 2 were placed on the photosensitive plate obtained, and was irradiated for 90 seconds with a 3 kW ultra-high pressure mercury light located at the height of 1 m from the plate. Then, the photosensitive plate was developed with water. The exposed area remained while the non-exposed area was washed away, whereby an image was formed. The image area of the screen printing plate obtained was rubbed with a gauze containing a mixed solvent consisting of acetone/wafter=70/30 100 times reciprocatingly, but the image having a thickness of 15$\mu$ on the screen was removed by the rubbing and the screen was exposed.

We claim:
1. A photosensitive resin composition comprising a photosensitive saponified poly(vinyl acetate) derivative containing in the backbone thereof at least one of a first group of photosensitive units which are represented by the general formula (I)

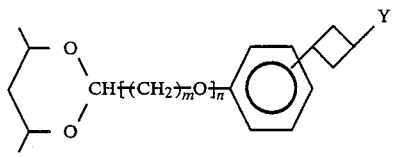

wherein

represents a vinyl alcohol residue in the backbone of the saponified polyvinyl acetate derivative:

represents ethenyl; Y represents a member selected from the group consisting of the following general formulae (II) and (III)

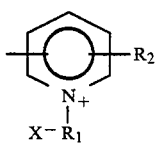

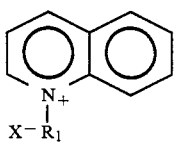

m denotes an integer of 1-6; n denotes 0 or 1; $R_1$ represents a member selected from the group consisting of a hydrogen, and unsubstituted alkyl and unsubstituted aralkyl, and alkyl and aryl containing a member selected from the group consisting of a hydroxyl, carbamoyl, and an ether bond and an unsaturated bond; $R_2$ represents a member selected from the group consisting of hydrogen and lower alkyl; and $X^-$ represents an anion, and at least one of a second group of photosensitive units having an ethylenic unsaturated double bond which are represented by the general formulae (IV) amd (V)

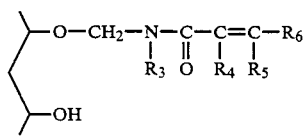

and

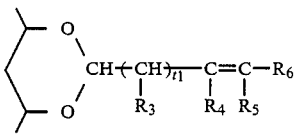

wherein

is as defined above; $R_3$ represents a member selected from the group consisting of a hydrogen, lower alkyl, nitrophenyl, halogen, an aminophenyl and phenyl; $R_4$, $R_5$ and $R_6$ respectively represents a member selected from the group consisting of hydrogen lower alkyl halogen and phenyl; and $t_1$ represents 0 or 1.

2. A photosensitive resin composition according to claim 1, wherein the degree of polymerization of said saponified poly(vinyl acetate) derivative is in the range of 300–4,000.

3. A photosensitive resin composition according to claim 1, wherein said saponified poly(vinyl acetate) derivative is a saponified polyvinyl acetate derivative obtained by saponifying poly(vinyl acetate).

4. A photosensitive resin composition according to claim 1, wherein the vinyl alcohol residue contained in the backbone of said saponified poly(vinyl acetate) derivative is a saponification product of homopolymer or copolymer of vinyl acetate and at least one ethylenic unsaturated compound and is a saponified poly(vinyl acetate) derivative which is obtained by saponifying said homopolymer or copolymer in which the vinyl acetate unit is in the range of 50–100 mole% prior to saponification.

5. A photosensitive resin composition according to claim 1, wherein 0–30 mole% of the vinyl alcohol unit contained in the vinyl structural units of said saponified poly(vinyl acetate) derivative is substituted by an acetal group.

6. A photosensitive resin composition according to claim 1, wherein the vinyl alcohol residue contained in the backbone of saponified poly(vinyl acetate) derivative is in the range of 50–100 mole%.

7. A photosensitive resin composition according to claim 1, wherein 0.1–20 mole% of the vinyl alcohol unit contained in the vinyl structural units of said saponified poly(vinyl acetate) derivative is substituted by the first group of said photosensitive units.

8. A photosensitive resin composition according to claim 1, wherein 1–40 mole% of the vinyl alcohol unit contained in the vinyl structure units of said saponified poly(vinyl acetate) derivative is substituted by the second group of said photosensitive units.

9. A photosensitive resin composition according to claim 1, wherein the vinyl alcohol structural unit is in a proportion of 50–98.9% to the vinyl structural units which are the backbone of said saponified poly (vinyl acetate) derivative substituted by the first group of said photosensitive units and the second group of said photosensitive units.

* * * * *